Earl M. Robertson
William West
INVENTORS
BY Daniel I. Mayne
W. H. McDowell
ATT'Y & AG'T.

United States Patent Office 2,732,301

Patented Jan. 24, 1956

2,732,301

PHOTOSENSITIZATION OF POLYMERS CONTAINING CINNAMOYL GROUPS

Earl M. Robertson and William West, Rochester, N. Y., assignors to Eastman Kodak Company, Rochester, N. Y., a corporation of New Jersey Application October 15, 1952, Serial No. 314,806

13 Claims. (Cl. 95—7)

Figures 1, 2, 3:
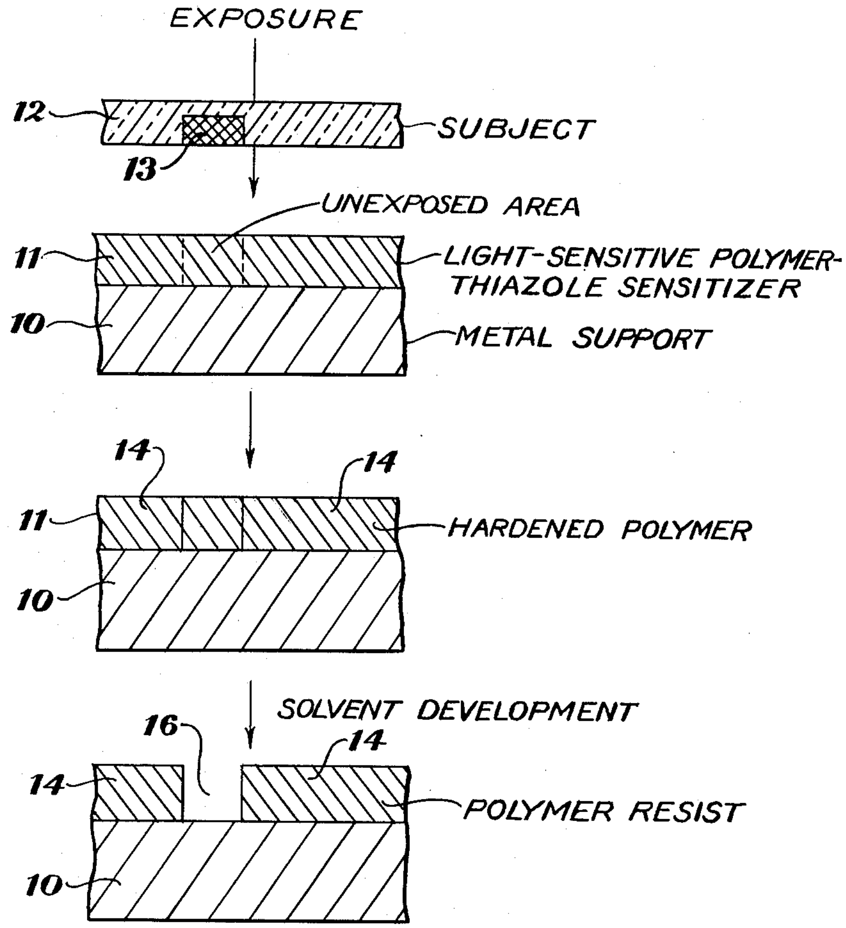

This invention relates to the photosensitization of light-sensitive polymeric materials and particularly to the photosensitization of cinnamic acid esters of polyvinyl alcohol.

It is well known in the art of photochemical reproduction to utilize various materials such as bichromated shellac, albumin, or polyvinyl alcohol for forming resist images upon various supports, such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of cinnamal ketone containing another resinous material which, after exposure under a design, may be selectively dissolved in the unexposed area whereby the area of the support thus bared may be etched.

In the Minsk et al. U. S. patent applications Serial No. 148,684 filed March 9, 1950, now U. S. Patent 2,610,120, and Serial Nos. 207,048–51 filed January 20, 1951, now U. S. Patents 2,690,966, 2,670,285, 2,670,286 and 2,670,287 respectively, are disclosed light-sensitive photomechanical resist compositions containing polymeric materials containing combined polymeric units having

R—CH=CH—CO— groups wherein R is an aryl group such as phenyl, m-nitrophenyl, etc., and the photosensitization of such polymers with nitro, triphenyl methane, anthrone, quinone, and ketone compounds. The photosensitization of such polymers, particularly polyvinyl cinnamate, results in obtaining light-sensitive compositions having light sensitivity many times greater than that of prevously known light-sensitive compositions such as noted above.

In the never-ending search for even more light-sensitive compositions, we have discovered new and much more effective light-sensitizing agents for the polymeric materials indicated.

Accordingly, one object of our invention is to provide the light-sensitive photomechanical resist compositions of enhanced light sensitivity. Other objects of our invention will become apparent from consideration of the following description.

The objects of our invention are accomplished by incorporating with an organic-solvent soluble, polymeric material containing combined polymeric units having groups of the general structure

R—CH=CH—CO— wherein R particularly represents a mononuclear aryl group, and as a light-sensitizing agent, either a compound having the general formula

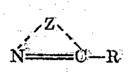

wherein Z represents the non-metallic atoms necessary to complete a thiazole ncleus, for example, a benzothiazole or naphthothiazole nucleus and R represents hydrogen, alkyl, aryl or alkylidene groups; or a compound having the general formula

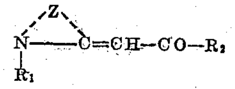

wherein Z represents the atoms necessary to complete a thiazole or selenazole nucleus, $R_1$ represents an alkyl group and $R_2$ represents either a hydrogen atom, alkyl or mononuclear aryl group such as methyl, ethyl, propyl, butyl, phenyl, m-chlorophenyl, etc. The quaternary ammonium salts of these two groups of sensitizing agents are also useful in the invention.

Examples of the novel light-sensitizing agents which can be used with any of the indicated polymers are the following:

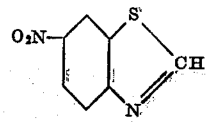

6-nitrobenzothiazole 140

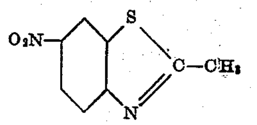

2-methyl-6-nitrobenzothiazole 180

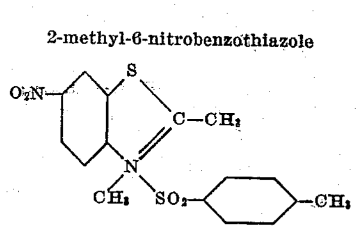

2,3-dimethyl-6-nitrobenzothiazolium-p-toluene sulfonate 40

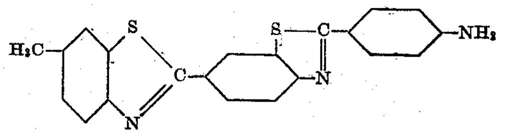

Primuline base (Color Index No. 812) 80

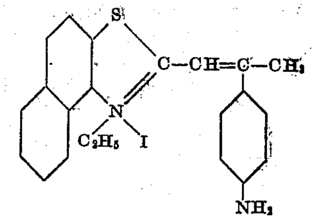

2(2-anilinopropenyl)-β-naphthothiazole ethiodide 90

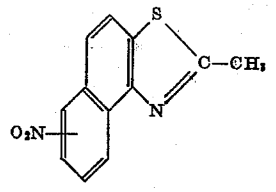

2-methyl-x-nitro-β-naphthothiazole 650

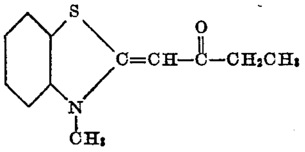

3-methyl-2-propionylmethylenebenzothiazoline 140

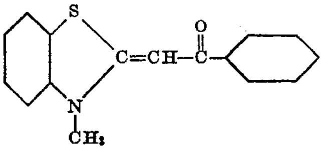

3-methyl-2-benzoylmethylenebenzothiazoline 250

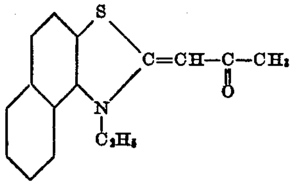

1-ethyl-2-acetylmethylene-β-naphthothiazoline 500

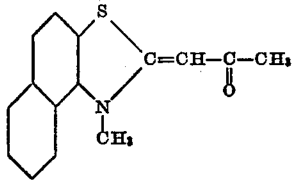

1-methyl-2-acetylmethylene-β-naphthothiazoline 500

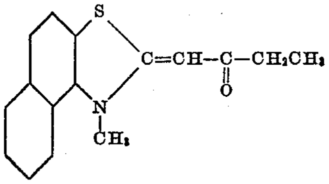

1-methyl-2-propionylmethylene-β-naphthothiazoline 650

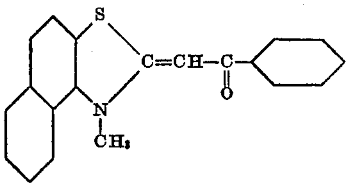

1-methyl-2-benzoylmethylene-β-naphthothiazoline 1400

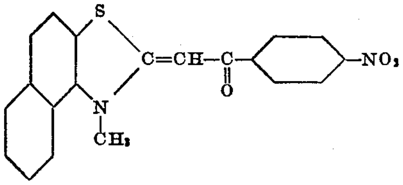

1-methyl-2-p-nitrobenzoylmethylene-β-naphthothiazoline 35

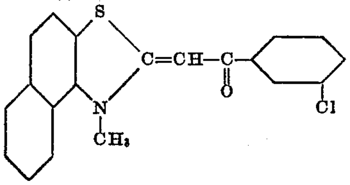

1-methyl-2-m-chlorobenzoylmethylene-β-naphthothiazoline 700

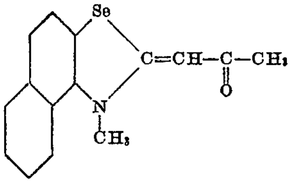

1-methyl-2-acetylmethylene-β-naphthoselenazoline 650

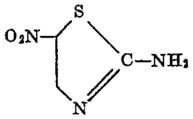

2-amino-5-nitrothiazole 110

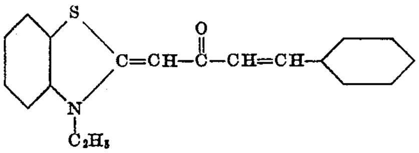

2-cinnamoylmethylene-3-ethylbenzothiazoline 350

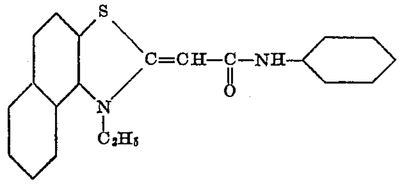

2-(anilinoformyl)methylene-1-ethyl-β-naphthothiazoline 500

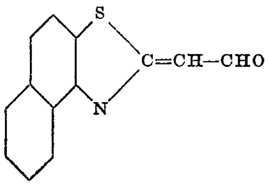

2-formylmethylene-1-methyl-β-naphthothiazoline 130

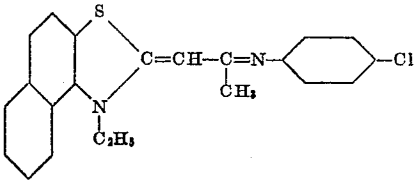

2-[2-(p-chlorophenylimino)propylidene]-1-ethyl-β-naphthothiazoline 220

The following are representative of cyanine dyes derived from simple thiazoles, benzothiazoles, benzoselenazoles, naphthothiazoles and benzoxazoles which are useful as sensitizers for the polymeric materials.

| | |
|---|---|
| 3,3′-diethyl-6,6′-dinitrothiacarbocyanine iodide | 40 |
| 3,3′-diethyl-4,5,4′,5′-dibenzothiacyanine iodide | 200 |
| 3,3′-dilauryloxacyanine perchlorate | 40 |
| 3,3′-dimethylthiacyanine bromide | 55 |
| 3,3′-dimethloxacarbocyanine iodide | 10 |
| 3,3′-di(p-nitrobenzyl)oxacarbocyanine iodide | 11 |
| 1′-ethyl-3-methylthia-2′-cyanine iodide | 40 |
| 1′,3-diethyl-6-nitrothia-2′-cyanine iodide | 50 |
| 3,3′-diethyl-4,5,4′,5′-dibenzothiacarbocyanine bromide | 7 |
| 3,3′-di(p-nitrophenyl)thiacarbocyanine iodide | 4 |

The speed values indicated after each compound are for fully esterified polyvinyl cinnamate sensitized with the particular compound and are relative to a speed value of 2 for unsensitized polyvinyl cinnamate.

The coatings from which the speed evaluations above were obtained were made from solutions of one part of chlorobenzene and three parts of toluene by volume containing 2.5 grams of polyvinyl cinnamate and 0.25 gram of the indicated thiazole compound per 100 cc. of solution. For comparison purposes on the same scale, a dichromate-sensitized shellac coating has a speed value of approximately 30.

From the above data it is apparent that the most effective sensitizing compounds are classifiable as compounds having the general structures given above.

The light-sensitive polymeric materials with which the above sensitizing agents are useful are those containing combined polymeric units having groups of structure

R—CH=CH—CO— wherein R represents a mononuclear aryl group, substituted or not. Particularly efficacious polymers having this polymeric unit are cinnamic acid esters of polyvinyl alcohols, starch, cellulose, as well as of partially alkyated cellulose or polyvinyl alcohol, either completely or partially hydroxy-alkylated cellulose on polyvinyl alcohol, and partially esterified cellulose or polyvinyl alcohol.

The preparation of cinnamic acid esters of polyvinyl alochol contempated for use in our invention is disclosed in the Minsk et al. U. S. patent application Serial No. 207,052, filed January 20, 1951. According to one method of that invention, polyvinyl alcohol is esterified with a cinnamic acid halide, for example, cinnamoyl chloride, until the selected number of recurring polymeric units of the polymer contain the light-sensitive

R—CH=CH—CO— groups. The most useful polymers made thereby are the polyvinyl cinnamates containing from about 60 to 100 mol percent of combined vinyl cinnamate groups, particularly polyvinyl cinnamate containing approximately 100 mol percent of $C_6H_5$—CH=CH—CO— groups, the molecule being substatially free of vinyl alcohol units. However, other cinnamic acid esters of polyvinyl alcohol containing from about 60 to 100 mol percent of such light-sensitive groups can be sensitized with the compounds of the invention.

The cinnamic acid esters of other hydroxyl-containing polymers, such as cellulose, are obtained in similar fashion by esterifying cellulose and its hydroxyl-containing derivatives indicated above with cinnamic acid halides.

Other polymers containing the light-sensitive group indicated are disclosed in the Unruh et al. U. S. patent applications Serial Nos. 246,515–8, filed September 13, 1951, and these polymers can be sensitized with the mentioned sensitizing agents with good results. Serial No. 246,517 is now U. S. Patent 2,706,725. These polymers are, for example, obtained by condensing polymers containing acetyl or even propionyl groups with various aldehydes to obtain benzal-ar-vinyl acetophenone polymers. Also, vinyl methyl ketone polymers condensed with aldehydes yield light-sensitive polymers which are sensitized with the compounds of our invention. For example, the condensation of polyvinyl methyl ketone with benzaldehyde yields a light-sensitive cinnamalvinyl ketone polymer, the light sensitivity of which is increased appreciably with the sensitizing agents of the invention, especially 2-benzoyl methylene-1-methyl-β-naphthothiazoline. A very useful cinnamic acid ester of hydroxy alkylated celluloses, hydroxy ethyl cellulose cinnamate, when sensitized with the compounds above, give extremely high light sensitivity, for example, a speed of 2500 with 2-benzoylmethylene-1-methyl-β-naphthothiazoline.

The cinnamic acid ester of β-hydroxy ethyl cellulose is prepared by precipitating a quantity of an aqueous solution of a commercial cellulose hydroxyethyl ether (Cellosize WS-500) by pouring it into a large excess of ethyl alcohol and washing in fresh alcohol. Ten grams of the resulting hydroxyethyl cellulose are then placed in 100 cc. of dry pyridine and heated on a steam bath under reflux for 16 hours in the absence of moisture. After cooling, 20 grams of cinnamoyl chloride are added. The reaction is exothermic and a light brown dope is obtained which is stirred and heated at 60° C. for 2 hours. The resultant dope is then thinned with acetone and poured into water to precipitate a light tan fibrous product β-hydroxy ethyl cellulose cinnamate. When the product was tested above for its light sensitivity, a sensitometric speed of 5 was obtained. The incorporation of 4,4′-tetramethyldiamino diphenyl ketone into the resin raised the sensitometric speed to 1400 and as mentioned, the thiazole compounds such as that immediately above raised the speed to the order of 2500.

The o-chloro cinnamate of β-hydroxyethyl cellulose is obtained by preparing 10 grams of hydroxyethyl cellulose in 100 grams of dry pyridine heated as above and adding 25 grams of o-chlorocinnamoyl chloride to the reaction mixture. The reaction is exothermic and stirring of the reaction mixture at 60° C. for 6 hours yields a dope which is diluted and precipitated into water. Analysis of the product indicated that it contained 12.7 percent chlorine.

The m-nitro cinnamate of β-hydroxyethyl cellulose is obtained by dispersing 10 grams of hydroxyethyl cellulose prepared as above in 100 cc. of dry pyridine and heating the mixture overnight. To this was added a slurry of 25 grams of m-nitrocinnamoyl chloride in 150 cc. of dry pyridine followed by heating at 60° C. for 8 hours. As before, the resultant dope is diluted with acetone and precipitated into water to obtain a white fibrous precipitate of the ester. The ester possesses the unusual property that without the addition of any sensitizing agent, it exhibited a speed of 650 an addition of the thizole sensitizing agents appreciably increase the light sensitivity.

The cinnamic acid esters of other hydroxy alkyl celluloses are prepared in a similar manner from hydroxy alkyl celluloses made, as well known, by reaction of cellulose with various alkylene oxides such as ethylene oxide, propylene oxide, butylene oxide, etc.

An indicated, the light-sensitive compositions containing the polymer and sensitizing agent are useful particularly in the photographic art wherein they can be utilized to form insoluble polymeric images on various supports. For this purpose, the light-sensitive polymers and sensitizing agent are dispersed in an organic solvent medium, for example, ethylene glycol monomethyl ether acetate in the case of cinnamic acid esters of polyvinyl alcohol, using from about 2 to 25 percent of the sensitizing agent based upon the weight of polymer present. The resulting dope is then uniformly coated on the desired surface, exposed with light to the subject to insolubilize the coating in the exposed region, followed by washing away the unexposed coating with organic solvent. The solvents used in this process will vary somewhat with the particular polymer employed; however, for the polyvinyl cinnamates, solvents disclosed in the Minsk et al. invention of U. S. patent application Serial No. 207,050 now U. S. Patent 2,670,286 are useful and the compositions can be put to the same uses noted in that invention.

In the accompanying drawings, the various figures show in enlarged cross-sectional view the structure of representative sensitive elements of our invention at various stages in the process of producing intermediate printing plates having selected areas covered by a polymeric resist image.

Fig. 1 of the drawings illustrates the exposure of a light-sensitive element comprising a metal support 10 and light-sensitive layer 11 of the invention prepared as above mentioned, the exposure being given to subject 12 having the light-absorbing image 13 preventing exposure in the areas of layer 11 as indicated. The result of exposure is to insolubilize areas 14 of layer 11 as shown in Fig. 2. When the exposed element of Fig. 2 is then treated with organic solvent to wash away the unexposed polymer, the element of Fig. 3 is obtained having a support 10, the insoluble polymeric resist image 14 whereas areas 16 of the support are bare. The resulting element of Fig. 3 thus obtained is used as desired in the particular process under consideration. If desired, this element can be used directly as a planographic printing plate providing the surface of support 10 is hydrophilic and capable of repelling greasy printing inks when moist. Otherwise the metal support can be etched and used for printing in well-known processes. The incorporation of suitable pigments into layer 11 of the element of Fig. 1 adapts the process to the production of color designs on various surfaces. In addition to the procedure illustrated, uniform coatings of the sensitive compositions of the invention may be applied to various supports, such as metal, and uniform exposure to light provides insoluble protective coatings on such surfaces.

An unusual property of the light-sensitizing agents of the invention employed with the indicated polymers resides in the optical sensitizing effect obtained; for example, polyvinyl cinnamate devoid of sensitizing agent is sensitive principally to wave lengths of light in the ultraviolet regions of the spectrum up to about 365 millimicrons. When 2-benzoylmethylene-1-methyl-β-naphthiazoline, is for example, employed as a sensitizing agent for polyvinyl cinnamate, the light sensitivity is extended to at least 435 millimicrons. An extension of light sensitivity is obtained with the other sensitizing agents employed with the indicated light-sensitive polymers.

What we claim is:

1. A photomechanical resist composition comprising as a combined carrier and light-sensitive material an organic solvent soluble polymeric material selected from the class consisting of cinnamic acid esters of polyvinyl alcohol, cinnamic acid esters of cellulose, cinnamic acid esters of hydroxyalkyl-celluloses, benzal - ar - vinylacetophenone polymers, and cinnamalvinyl ketone polymers, and as a light-sensitizing agent for the polymeric material a member of the class consisting of (1) compounds having the general formula

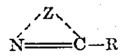

wherein Z represents the non-metallic atoms necessary to complete a thiazole nucleus and R represents a member of the class consisting of hydrogen, aryl, alkyl and alkylidene groups, (2) compounds having the general formula

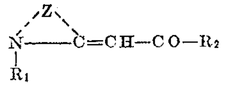

wherein Z represents the atoms necessary to complete thiazole and selenazole nuclei, $R_1$ represents an alkyl group and $R_2$ represents a member of the class consisting of hydrogen, alkyl and mononuclear aryl groups, and quaternary nitrogen salts of said compounds, and (3) cyanine dyes derived from thiazoles, benzothiazoles, benzoselenazoles, naphthathiazoles and benzoxazoles.

2. A photomechanical resist composition comprising as a combined carrier and light-sensitive material an organic solvent soluble polymeric material selected from the class consisting of cinnamic acid esters of polyvinyl alcohol, cinnamic acid esters of cellulose, cinnamic acid esters of hydroxyalkyl-celluloses, benzal - ar - vinylacetophenone polymers, and cinnamalvinyl ketone polymers, and as a light-sensitizing agent for the polymeric material, a compound having the general formula

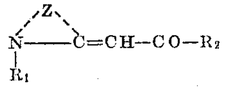

wherein Z represents the non-metallic atoms necessary to complete a benzothiazole nucleus, $R_1$ represents an alkyl group and $R_2$ represents a mononuclear aryl group.

3. A photomechanical resist composition comprising as a combined carrier and light-sensitive material an organic solvent soluble polymeric material selected from the class consisting of cinnamic acid esters of polyvinyl alcohol, cinnamic acid esters of cellulose, cinnamic acid esters of hydroxyalkyl-celluloses, benzal - ar - vinylacetophenone polymers, and cinnamalvinyl ketone polymers, and as a light-sensitizing agent for the polymeric material, a compound having the general formula

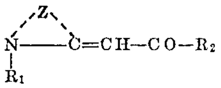

wherein Z represents the non-metallic atoms necessary to complete a benzothiazole nucleus, $R_1$ represents an alkyl group and $R_2$ represents an alkyl group.

4. A photomechanical resist composition comprising as a combined carrier and light-sensitive material an organic solvent soluble polymeric material selected from the class consisting of cinnamic acid esters of polyvinyl alcohol, cinnamic acid esters of cellulose, cinnamic acid esters of hydroxyalkyl-celluloses, benzal - ar - vinylacetophenone polymers, and cinnamalvinyl ketone polymers, and as a light-sensitizing agent for the polymeric material, a compound having the general formula

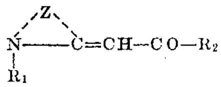

wherein Z represents the non-metallic atoms necessary to complete a β-naphthothiazole nucleus, $R_1$ represents an alkyl group and $R_2$ represents a mononuclear aryl group.

5. A photomechanical resist composition comprising as a combined carrier and light-sensitive material an organic solvent soluble polymeric material selected from the class consisting of cinnamic acid esters of polyvinyl alcohol, cinnamic acid esters of cellulose, cinnamic acid esters of hydroxyalkyl-celluloses, benzal - ar - vinylacetophenone polymers, and cinnamalvinyl ketone polymers, and as a light-sensitizing agent for the polymeric material, a compound having the general formula

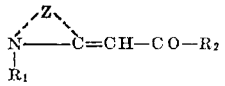

wherein Z represents the non-metallic atoms necessary to complete a β-nahthothiazole nucleus, $R_1$ and $R_2$ represent alkyl groups.

6. A photomechanical resist composition comprising polyvinyl cinnamate as the combined carrier and light-sensitive material, and as a light-sensitizing agent, a compound having the general formula

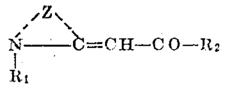

wherein Z represents the non-metallic atoms necessary to complete a benzothiazole nucleus, and $R_1$ and $R_2$ represent alkyl groups.

7. A photomechanical resist composition comprising polyvinyl cinnamate as the combined carrier and light-sensitive material, and as a light-sensitizing agent, a compound having the general formula

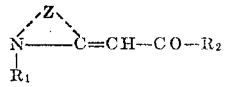

wherein Z represents the non-metallic atoms necessary to complete a benzothiazole nucleus, $R_1$ represents an alkyl group and $R_2$ represents a mononuclear aryl group.

8. A photomechanical resist composition comprising polyvinyl cinnamate as the combined carrier and light-sensitive material, and as a light-sensitizing agent, a compound having the general formula

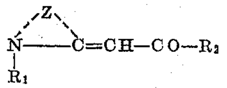

wherein Z represents the non-metallic atoms necessary to complete a β-naphthothiazole nucleus, $R_1$ represents an alkyl group and $R_2$ represents a mononuclear aryl group.

9. A photomechanical resist composition comprising polyvinyl cinnamate as the combined carrier and light-sensitive material, and as a light-sensitizing agent, a compound having the general formula

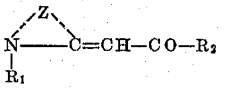

wherein Z represents the non-metallic atoms necessary to complete a β-naphthothiazole nucleus and $R_1$ and $R_2$ represent alkyl groups.

10. A photomechanical resist composition comprising polyvinyl cinnamate as the combined carrier and light-sensitive material, and as a light-sensitizing agent, a compound of the class consisting of 6-nitrobenzothiazole, 2-methyl-6-nitrobenzothiazole, 2-methyl-x-nitronaphthothiazole, 3 - methyl - 2 - propionylmethylenebenzothiazoline, 3-methyl - 2 - benzoylmethylenebenzothiazoline, 1-ethyl-2-acetylmethylene-β-naphthothiazoline, 1 - methyl-2-acetylmethylene-β - naphthothiazoline, 1-methyl-2-propionylmethylene-β-naphthothiazoline, 1 - methyl - 2- benzoylmethylene-β-naphthothiazoline, 1-methyl-2-m-chlorobenzoylmethylene-β-naphthothiazoline, 1 - methyl-2-acetylmethylene-β-naphthoselenazoline, 2 - amino-5-nitrothiazole, 2-cinnamoylmethylene - 3 - ethylbenzothiazoline, 2-(anilinoformyl)methylene-1-ethyl-β-naphthothiazoline, 2-formylmethylene - 1 - methyl-β-naphthothiazoline, 2-[2-(p - chlorophenylimino)propylidene]-1-ethyl-β-naphthothiazoline and 3,3′-diethyl - 4,5,4′,5′ - dibenzothiacyanine iodide.

11. A photomechanical resist composition comprising a cinnamic acid ester of a hydroxyalkyl ether of cellulose as the combined carrier and light-sensitive material, and as a light-sensitizing agent, a compound having the general formula

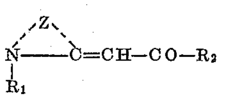

wherein Z represents the atoms necessary to complete a β-naphthothiazole nucleus, $R_1$ represents an alkyl group and $R_2$ represents a mononuclear aryl group.

12. A photomechanical composition comprising hydroxy ethyl cellulose cinnamate as the combined carrier and light-sensitive material, and 2-benzoylmethylene-1-methyl-β-naphthothiazoline as a light-sensitizing agent.

13. A photomechanical resist composition comprising polyvinyl cinnamate as the combined carrier and light-sensitive material, and 2-benzoyl methylene-1-methyl-β-naphthothiazoline as a light-sensitizing agent.

References Cited in the file of this patent

UNITED STATES PATENTS

| | | |
|---|---|---|
| 1,587,274 | Beebe et al. | June 1, 1926 |
| 2,091,715 | Murray | Aug. 31, 1937 |
| 2,218,230 | Carroll | Oct. 15, 1940 |
| 2,226,158 | Davey | Dec. 24, 1940 |
| 2,610,120 | Minsk et al. | Sept. 9, 1952 |

FOREIGN PATENTS

| | | |
|---|---|---|
| 512,914 | Great Britain | Sept. 28, 1939 |
| 573,798 | Great Britain | Dec. 6, 1945 |